United States Patent [19]

Brahmbhatt

[11] Patent Number: 5,583,808
[45] Date of Patent: Dec. 10, 1996

[54] EPROM ARRAY SEGMENTED FOR HIGH PERFORMANCE AND METHOD FOR CONTROLLING SAME

[75] Inventor: Dhaval J. Brahmbhatt, San Jose, Calif.

[73] Assignee: National Semiconductor Corporation, Santa Clara, Calif.

[21] Appl. No.: 307,340

[22] Filed: Sep. 16, 1994

[51] Int. Cl.$^6$ .................................................. G11C 5/06
[52] U.S. Cl. .................. 365/185.05; 365/63; 365/185.06
[58] Field of Search ................................. 365/63, 185.05, 365/185.06, 185.33, 185.18, 185.25

[56] References Cited

U.S. PATENT DOCUMENTS

| | | | |
|---|---|---|---|
| 5,023,681 | 6/1991 | Ha | 357/23.5 |
| 5,241,497 | 8/1993 | Komarek | 365/203 X |
| 5,295,105 | 3/1994 | Atsumi | 365/185 X |
| 5,313,432 | 5/1994 | Lin et al. | 365/185 X |
| 5,319,593 | 6/1994 | Wolstenholme | 365/185 |
| 5,327,378 | 7/1994 | Kazerounian | 365/185 |
| 5,379,254 | 1/1995 | Chang | 365/182 X |

FOREIGN PATENT DOCUMENTS

| | | |
|---|---|---|
| 0461764 | 12/1991 | European Pat. Off. . |
| 0529862 | 3/1993 | European Pat. Off. . |

*Primary Examiner*—Do Hyun Yoo
*Attorney, Agent, or Firm*—Limbach & Limbach L.L.P.

[57] ABSTRACT

An EPROM memory array and method of controlling the array. The array is divided into array segments, with each segment having alternating bit and source lines. Each segment includes several rows of cells, with each cell in the row having a control gate connected to the word line, a drain connected to one of the bit lines and a source connected to the source line adjacent the bit line. Pairs of cells in a row will have common sources connected to one of the source lines and respective drains connected to the two bit lines adjacent the source line. A selected cell is read utilizing a pair of segment select transistors which selectively connect a positive voltage to the bit line connected to the drain of the selected cell, with the source of the cell being grounded. The bit lines connected to the drains are thus selectively accessible and isolatable so that they need extend over only a single segment of the array. This results in a low capacitance bit line which can be rapidly switched between states during successive read operations thereby greatly increasing the speed of memory read operations.

20 Claims, 6 Drawing Sheets

EPROM ARRAY SEGMENTED FOR HIGH PERFORMANCE AND METHOD FOR CONTROLLING SAME

BACKGROUND OF THE INVENTION

1. Field of the Invention

The present invention relates generally to non-volatile memories and in particular to an erasable programmable read only memory or EPROM having a segmented array of memory cells so as to provide high performance and a method for controlling the memory.

2. Background Art

There has been a tendency to reduce the size of EPROMs so as to increase data storage capacity and to increase the speed of operation. Referring to the drawings, FIG. 1 shows a conventional EPROM memory array with control circuitry removed. The array, which has a capacity of 1 Megabit, is comprised of N channel cells of the floating gate variety, with each cell including a drain, a source, a channel region intermediate the drain and source and a polysilicon floating gate overlying the channel region and insulated from the region. A polysilicon control gate overlies the floating gate and is insulated from the floating gate. For purposes of definition, the drain region of the disclosed N channel cells 10 is the most positive of the drain/source regions when the cell is being read.

The floating gate cells 10 are arranged in 1024 rows and 1024 columns to form a 1 megabit array. In the exemplary array, all of the cells 10 have their source regions connected to circuit common. All of the cells 10 located in a particular column have their drain regions connected to a common bit line BL1–BL1024. The bit lines may be implemented by way of a metal bit line or by way of a buried doped semiconductor line. All of the cells 10 located in a particular row have their control gates connected to a common word line WL1–WL1024. The word lines are typically implemented by way of doped polysilicon lines.

Programming of the individual cells is accomplished by applying a relatively high positive voltage to the bit line associated with the cell 10 to be programmed. In addition, a positive voltage is applied to the word line associated with the cell to be programmed. The resultant electric field causes electrons to travel from the grounded source region to the positive drain region. Some of these accelerated electrons will acquire sufficient energy to pass through the insulating oxide intermediate the channel and the floating gate and be deposited on the floating gate. This mechanism, sometimes called hot electron injection, places a negative charge on the floating gate which will increase the threshold voltage of the cell above that when the cell in the erased state.

Reading of the individual cells is accomplished by applying a small positive voltage to the bit line associated with the cell to be read. In addition, a positive voltage is applied to the word line associated with the cell. In the event the cell being read is in an erased state, the positive voltage applied to the word line will be in excess of the erased threshold voltage of the cell so that the cell will be rendered conductive. Current will flow from the bit line and through the cell to the circuit common. A sense amplifier connected to the bit line (not depicted) will detect the current flow thereby indicating the erased state of the cell being read. In the event the cell had been previously programmed, no current will flow, thereby indicating the programmed state of the cell being read.

The cells 10 are erased by subjecting the cells to ultraviolet light. Typically, the integrated circuit package containing the array is provided with a window through which the light may pass. The light will cause any charge present on the floating gate to be removed. No voltages are applied during U.V. erase.

Memory program and memory erase operations require at least an order of magnitude more time than do memory read operations. For this reason alone, EPROM devices are primarily intended to function as read mostly devices. That is, once the device has been programmed, it is anticipated that almost all of the subsequent operations will be read operations. Thus, the speed of memory read operations essentially determines the overall speed of the EPROM for all practical purposes.

One of the primary limitations on reading speed is the inherent capacitance associated with the memory bit lines. Some of this capacitance is attributable to the capacitive coupling between the associated bit line and the surrounding structure, with the remainder of the capacitance being attributable to the capacitance of the drain region of all of the cells connected to the bit line. This capacitance is particularly large in the exemplary FIG. 1 array in that the bit line extends the full length of the array and is connected to each of the 1024 cells located in the associated array column.

The delays associated with the capacitance are exacerbated when the bit lines have a significant resistance. The resultant large RC time constant significantly impedes the speed of memory read operations, particularly when the bit line is implemented in the form of a doped semiconductor line, either diffused or ion implanted, rather than a metal line.

One approach to overcoming such speed limitation is to use memory cells that produce large currents when read. These large currents decrease the time necessary to charge and discharge the bit lines. However, large cell currents inherently require large geometry cells. Large geometry cells obviously result in a decrease in the number of cells which can be implemented in an integrated memory device and further result in the undesirable parasitic capacitance previously discussed.

The effects of bit line capacitance can be reduced by segmenting the bit line. By way of example, FIG. 2 shows part of a prior art memory cell array utilizing a segmenting technique. Only part of a single array column is depicted, namely, a column associated with a bit line BL1. The array includes a Segment 1 comprising rows 1–32 of cells 10 and a Segment 2 comprising rows 33–64 of the cells. Other segments can be added as required and the size of the segments can be increased to include 64, 128, etc. rows in each segment. Further, the number of columns present in each segment can be increased.

Each segment is connected to the associated bit line BL1 by a segment select transistor, with Segment 1 being connected by way of transistor 12 and Segment 2 connected by way of transistor 14. Depending upon the read address, only one of the segments is selected at one time by way of appropriate segment select transistors SS1, SS2, etc. Thus, the total capacitance associated with the bit lines is substantially reduced. By way of example, if Segment 1 is selected, select transistor 12 is made active with the remaining select transistors being maintained off. Thus, only the capacitance associated with the drains of cells 1–32 must be charged and discharged during the read operation. Bit line BL1 still extends the full length of the array, but the capacitance attributable to the bit line alone is significantly smaller than that associated with the drain regions of the cells 10 of the non-selected segments.

There has also been a tendency in the prior art to reduce the area required of a memory array by alternating metal bit lines and diffused semiconductor bit lines. Since metal bit lines require much more area to implement than do semiconductor bit lines, the use of alternating metal and semiconductor lines reduces the area of each cell significantly. Such arrays are sometimes referred to as alternate metal virtual ground or AMG arrays.

FIG. 3 shows an exemplary prior art AMG array of memory cells 10. The array includes multiple segments including a Segment 1 comprising rows 1–64 and columns of cells 1–6. An actual array would include many more columns. The next segment is Segment 2 and includes rows 64–128, with only one row being depicted. Typically, there would be additional segments in the AMG array.

The cells in a row are arranged in pairs, with each pair sharing a common source region. By way of example, adjacent cells 10A and 10B located in the row associated with word line WL2 include a common N type source region. Cell pair 10E and 10F located in the row associated with word line WL3 also share a common N type source region diffusion which is connected by a buried N type semiconductor bit line BLB to the common source region diffusion of cells 10A and 10B. Similarly, cells 10B and 10C in adjacent cell pairs have a common N type drain region diffusion which is connected by a buried N type semiconductor bit line BL2 to the common drain region of cells 10F and 10G.

Alternate bit lines, including line BL1, BL2 and BL3 are each connected in parallel with an overlying metal track (not shown). The metal tracks are connected to the buried bit lines by way of contacts 16 located at the top and bottom of each segment.

Each segment of the conventional AMG array has an associated set of segment select transistors SSN which are controlled by complementary segment select signals SN and $\overline{SN}$. The segment select signals are controlled by address decoding circuitry so that only one of the array segments will be enabled during a read or write operation. When Segment 1 is enabled, a selected one of signals S1 and $\overline{S1}$ is active and the other segments select signals SN and $\overline{SN}$ are inactive. Similar segment select transistors are located on the opposite side of each segment and are connected in parallel with the transistors located at the top of the array and are driven by the same select signal SN and $\overline{SN}$. This parallel arrangement of segment select transistors at opposite sides of the bit lines tends to reduce the effect of bit line resistance by one-half.

Operation of the AMG array can best be described by way of example. Assume that cell 10B is to be read. Control circuitry (not depicted) will cause a positive voltage to be applied to bit line BL2 by way of a load circuitry (also not depicted). This voltage will thus be applied directly to the drain region of cell 10B. The control circuitry will also ground bit line BL1. The remaining bit lines BLN are also maintained at the same positive voltage as bit line BL2. Segment select signal $\overline{S1}$ will be active (high) and S1, by definition will be inactive. Thus, segment select transistor SS1 will be rendered conductive and transistor $\overline{SS1}$ will remain off. Conductive transistor SS1 will connect the source region of cell 10B to grounded bit line BL1. In addition, the control circuitry will connect a positive voltage to word line WL2.

Assuming that cell 10B is in an erased state, the above conditions will render cell 10B conductive. Current will flow from bit line BL2, through the cell, into bit line BLB, through transistor SS1 to the grounded bit line BL1. Sense circuitry will detect the resultant change in voltage at the load connected to bit line BL2 thereby sensing the state of cell 10B.

The deselected word lines of the array are all grounded so that the cells of the deselected rows will remain non-conductive irrespective of programmed state. With respect to cell 10A in the selected row, this cell will remain non-conductive since both the drain and source of the cell are at ground potential. This is also true of the cells in the selected row to the left of selected cell 10A. Cell 10C will remain non-conductive since conductive transistor SS2 will cause both the source and drain to be at the same positive voltage. With respect to cell 10D, as previously noted, the deselected bit line BLN, with the exception of line BL1, are at the same positive potential as bit line BL2 so that both the drain and source of the cell are at the same potential as are the other cells in the row to the right of cell 10D. Thus, these deselected cells will remain nonconductive.

Programming of selected cell 10B is accomplished by bringing bit line BL2 to a positive voltage and grounding the remaining bit lines BLN through a high impedance load. A large positive voltage is applied to the selected word line WL2 and the deselected word lines are grounded. Again, select signal $\overline{S1}$ is made active and S1 inactive so that line BLB connected to the source of cell 10B is at ground potential and the drain connected to bit line BL2 is at a positive potential. This combination of voltages will cause cell 10B to be programmed. The cells in the deselected rows will not be programmed since the deselected word lines are all grounded. With respect to cell 10A in the selected row, the source and drain will be at the same low potential so that programming will not take place. Cell 10C will not be programmed because the drains and sources of the cells will be at the same high potential due to transistor SS2 being conductive. Cell 10D will have its source at a high potential and its drain presented with a high impedance to ground so that it will also not become programmed.

It can be seen that when successive memory cell reads take place, it is likely that one or more of the bit lines BLN will have to switch between high and low level states. Although the bit lines have a relatively low resistance by virtue of the overlying metal bit track connected in parallel, the bit lines extend over the full length of the array, interconnecting each of the array segments, including the relatively high capacitance of each cell of the array connected to the bit lines. Since, as previously noted, the time required to carry out read operations is the limiting factor in the overall speed performance of this type of read mostly memory, it can be seen that the AMG array speed is reduced.

The AMG array is capable of achieving a high cell density but suffers from a speed disadvantage due to the bit line capacitance previously described. A memory array which provides both the density of AMG arrays, but minimizes the speed shortcomings of such arrays would be highly desirable. The subject invention achieves both of these goals. These advantages of the subject invention and other advantages will be apparent to those skilled in the art upon a reading of the following Detailed Description of the Invention together with the drawings.

SUMMARY OF THE INVENTION

An EPROM memory system which includes an array of floating gate memory cells, select means and control means is disclosed. The memory array includes a plurality of array segments, with each segment including alternating bit and source lines. Preferably, the bit and source lines are parallel lines implemented in the form of buried semiconductor lines, with the source line having an overlying metal line connected in parallel.

Each array segment further includes a multiplicity of rows, with each row including a word line and a first memory cell having a control gate connected to the word line. The first cell further includes a drain connected to a first one of the bit lines, a source connected to a first one of the source lines adjacent the first bit line. Each row further includes a second cell having a control gate also connected to the word line, a source connected to the first source line and a drain connected to a second bit line adjacent the first source line. In a typical application, there may be a very large number of cells located in one row, such as a thousand cells, together with associated source/bit lines.

The select means of the subject memory system is a means for selectively connecting a first node to one of the first and second bit lines. The first node is electrically isolated from the first source line. The select means is preferably implemented as a pair of transistors having a common terminal connected to the first node and respective remaining terminals connected to the first and second bit lines.

The control means of the subject memory system is a means for programming and reading selected cells of the memory array. Read means is provided for reading a selected cell by applying a positive voltage, with respect to the array circuit common, to the first node and by causing the select means to connect the first node to the bit line connected to the drain of the selected cell.

The above-described memory system permits the bit line connected to the common drains of the memory cells to be selectively isolated and accessed by the claimed select means. Thus, it is not necessary for bit line connected to the cell drains of a cell column to extend across each segment of the array. Since it is the drain region of the cells which must be rapidly switched between voltage states during successive memory read operations, the inherently low capacitance of such isolatable bit lines permits fast successive read operations.

DETAILED DESCRIPTION OF THE INVENTION

Figure 4:
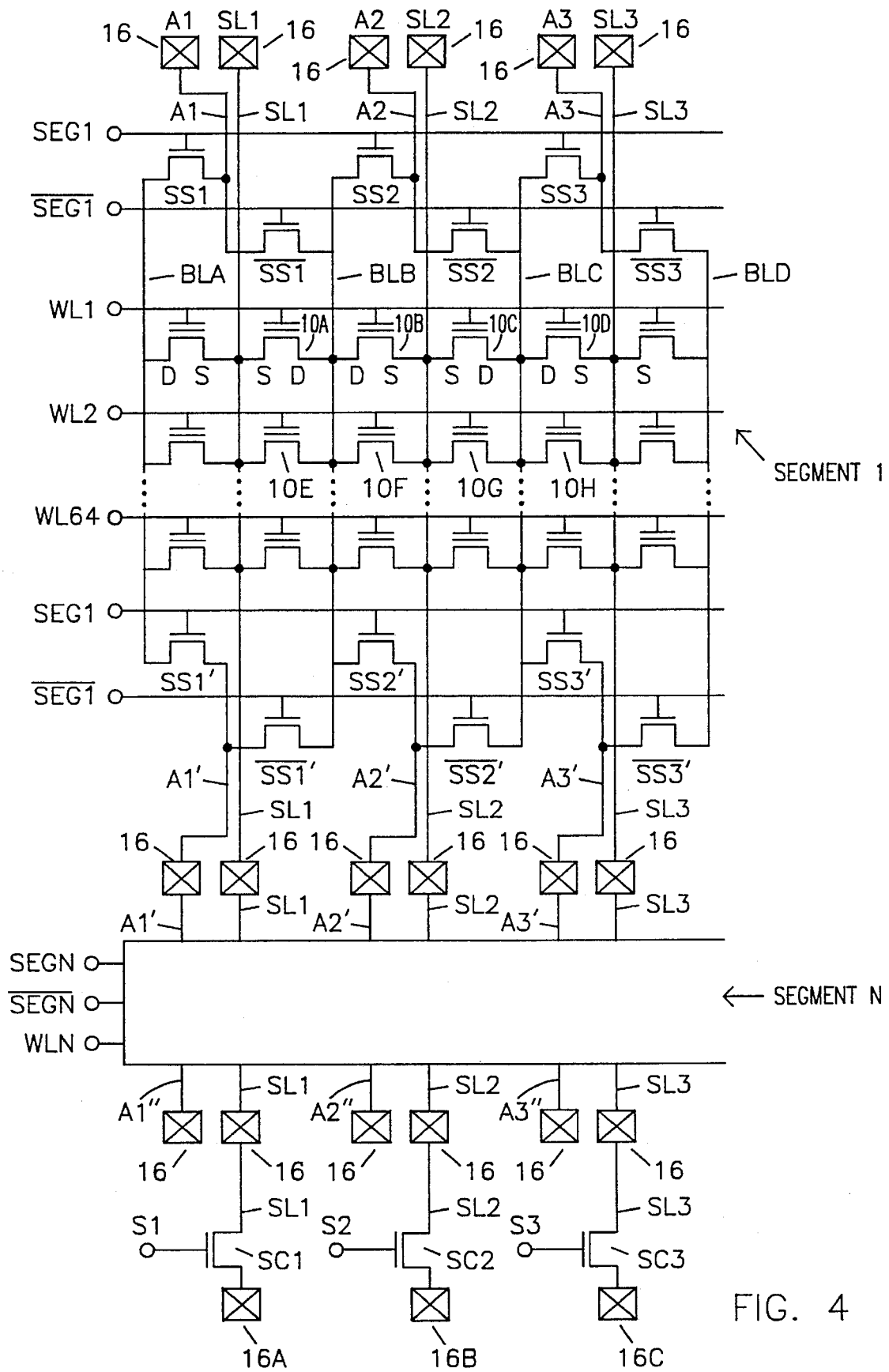
FIG. 4 is a diagram of a memory array in accordance with the present invention.

Referring again to the drawings, FIG. 4 shows a memory array in accordance with the present invention. The subject array is a segmented array containing segments 1—N. Each segment includes a total of 64 rows of memory cells 10 which can be of the same type of N channel cells utilized in conventional AMG arrays.

The cells 10 of the subject array are arranged in rows and columns, with each cell located in a particular row having its control gate connected to a common word line. The cells in a row are arranged in pairs, with the N type drain regions of the cell pairs being formed in common. For example, the cell pair 10A and 10B share a common drain region as do cell pair 10E and 10F located in the adjacent row. The N type drain regions of cells in a particular column are connected in common by a buried N type bit line, such as bit line BLB associated with cell pair 10A and 10B in one row and cell pair 10E and 10F in the adjacent row. Note that the bit lines BLN are relatively short and extend only the length of one segment of the array.

The cells of adjacent cell pairs have commonly formed source regions. By way of example, cells 10B and 10C have common N type source regions as do cells 10F and 10G in the adjacent row. The source regions of cells located in a particular column are connected to the source regions of cells in the same column by way of a buried N type diffusion which forms a common source line SLN associated with the column. By way of example, cells 10F and 10G have a common source region connected to the common source region of cells 10B and 10C by way of source line SL2.

Each segment N of the array includes a group of segment select transistors SSN and $\overline{SSN}$. The segment select transistors are arranged in pairs, with each pair having a common connection connected to a segment line AN. By way of example, select transistor pair SS1 and $\overline{SS1}$ have a common connection to segment line A1. The select transistor pairs are connected between adjacent bit lines BL. By way of further example, transistor pair SS1 and $\overline{SS1}$ are connected between bit lines BLA and BLB. The segment select transistors SSN and $\overline{SSN}$ are controlled by complementary segment select signals SEGN and $\overline{SEGN}$ which are, in turn, generated in response to address decoding circuitry (not depicted).

Each segment of the array preferably includes a second set of segment select transistors SSN' and $\overline{SSN}$' located at the opposite side of the segment from segment select transistors SSN and $\overline{SSN}$. The bottom set of select transistors are controlled by the same segment select signals SEGN and $\overline{SEGN}$ as the first set. The bottom set of select transistors are arranged in pairs having a common connection to an associated segment line AN', each of which is connected to a contact 16. For example, transistors SS1' and $\overline{SS1}$' are connected to segment line A1'. In addition, each pair of the bottom set of select transistors is connected between adjacent bit lines. The segment lines AN, AN' have overlying metal bit lines (not shown) connected between adjacent contacts 16 so that all of the segment lines associated with a single column of the array are electrically connected together.

The source lines SLN of an array segment are connected to the source line of each of the other segments of the array. By way of example, source line SL1 of Segment 1 is connected to source line SL1 of Segment N. There is a contact 16 to each source line for each segment of the array which contacts an overlying metal track (not depicted) connected in parallel with the buried source line.

Each source line SLN has an associated source control transistor SCN which is connected between the line and a contact 16N. By way of example, source line SL1 is terminated in source control transistor SC1. The source control transistors are controlled by signals SN. For example, transistor SC1 is controlled by signal S1.

In operation, a selected cell 10 is programmed by first deactivating all of the segment select signals SEGN in the segments in which the selected cell is not located. Thus, the segment select transistors SSN in these deselected segments will remain non-conductive. Next, the segment select transistor connected to the bit line associated with the cell to be programmed is turned on by the appropriate segment select signal SEGN. For example, assuming that cell 10B is to be programmed, signal SEG1 is made active and $\overline{SEG1}$ inactive. This will cause transistor SS2 to become conductive and connect the drain of cell 10B to segment line A2.

In addition, in order to program cell 10B, control circuitry will connect a positive voltage to segment line A2. Thus, a positive voltage will be applied to the drain of cell 10B by way of transistor SS2. Further, signal S2 will be rendered active so that source select transistor SC2 will be turned on. Contact 16B is further grounded so that the source line SL2 connected to the source of cell 10B will be connected to ground. The remaining source select transistors remain turned off. The selected word line WL1 is brought to a high voltage and the deselected word lines are grounded. Under the foregoing conditions, cell 10B will be programmed by hot electron injection. Programming current will flow from line A2, through transistor SS2, through the cell and to ground by way of transistor SC2.

The cells 10 in the deselected rows will not be programmed since the associated word lines are grounded. Cell 10A will not be programmed since the associated source select transistor SC1 will be turned off. Further, cell 10C will not be programmed since that cell does not have a high voltage applied to the drain because transistor $\overline{SS2}$ will be turned off.

Read operations are carried out by applying a positive voltage to the segment line AN associated with the cell to be read. For example, if cell 10B is to be read, a positive voltage will be applied to line A2. In addition, signal SEG1 is made active so that the positive voltage will be applied to the drain of cell 10B. Contact 16B is grounded by the control circuitry. Further, the source of cell 10B is connected to ground by operation of signal $2 which renders transistor SC2 conductive. Finally, a positive voltage is applied to the selected word line WL1 and the deselected word lines are grounded.

The cells are erased in the conventional manner utilizing U.V. light. All voltages are turned off when U.V. erase is carried out.

Under the foregoing conditions, the drain of cell 10B is connected to a positive voltage and the source is grounded. If the cell 10B is in an erased state, the positive voltage on the word line WL2 will be sufficiently to render the cell conductive. A sense amplifier (not depicted) connected to line A2 will detect the presence of current and will indicate the erased state of the cell 10B.

Figure 1:
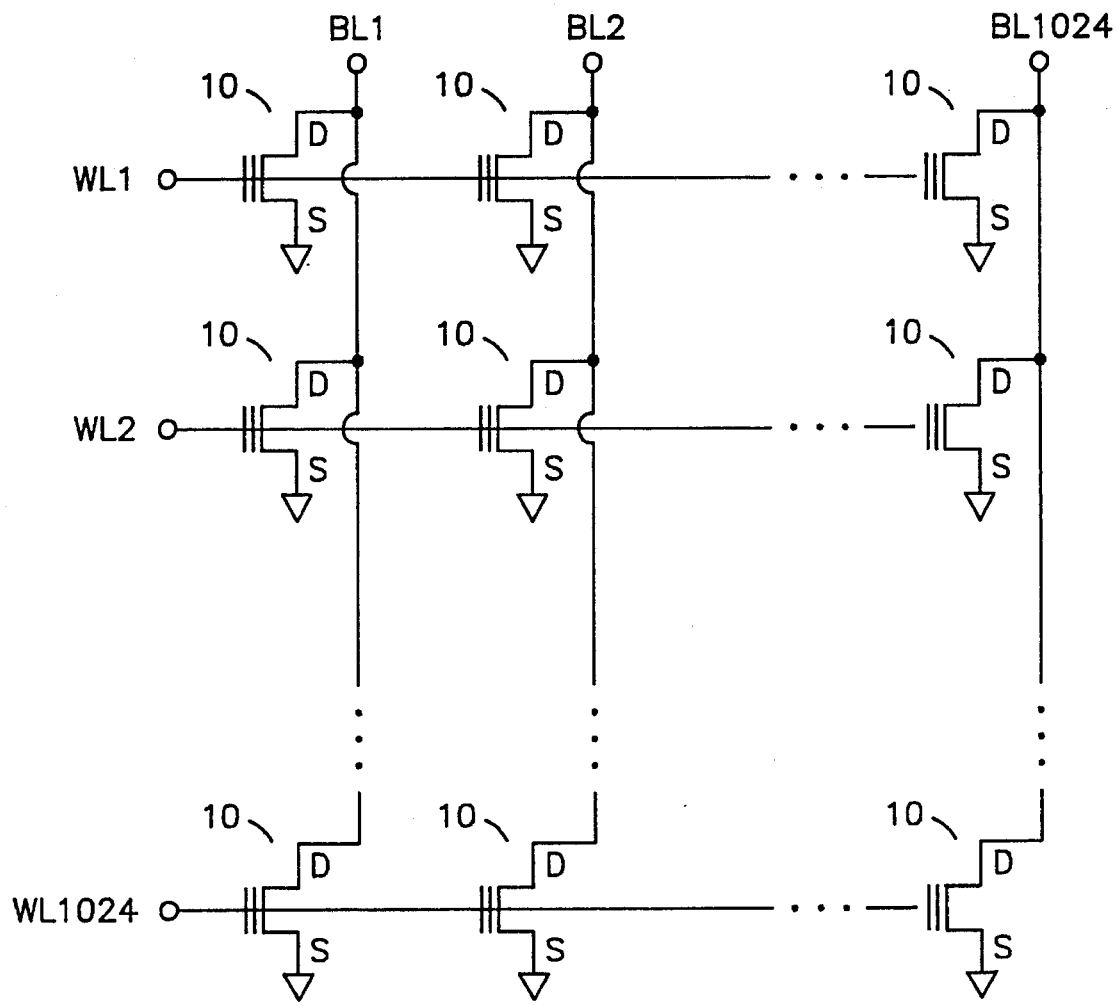
FIG. 1 is a diagram of a conventional memory array.
Figure 2:
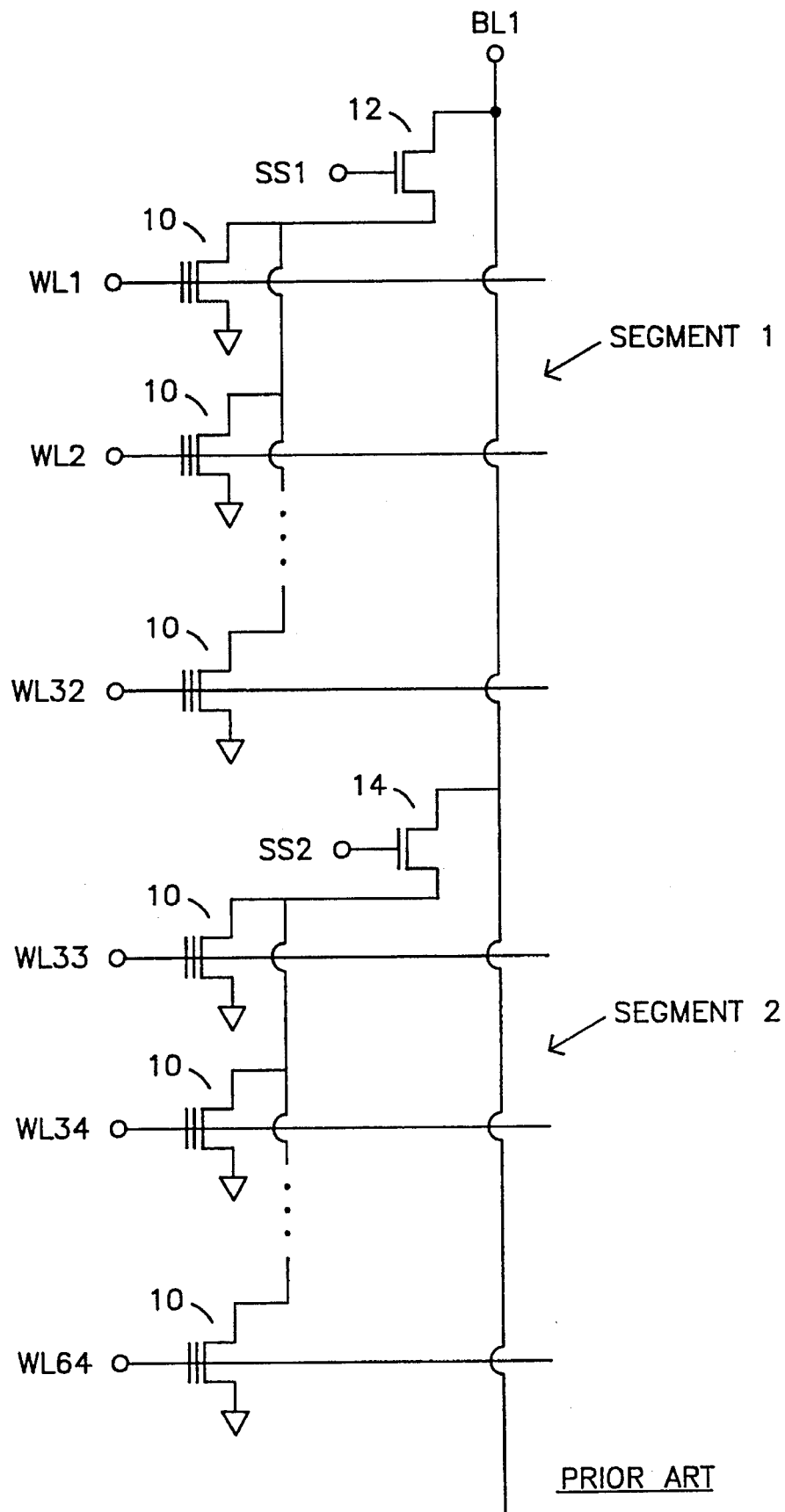
FIG. 2 is a diagram of a portion of a conventional segmented memory array.
Figure 3:
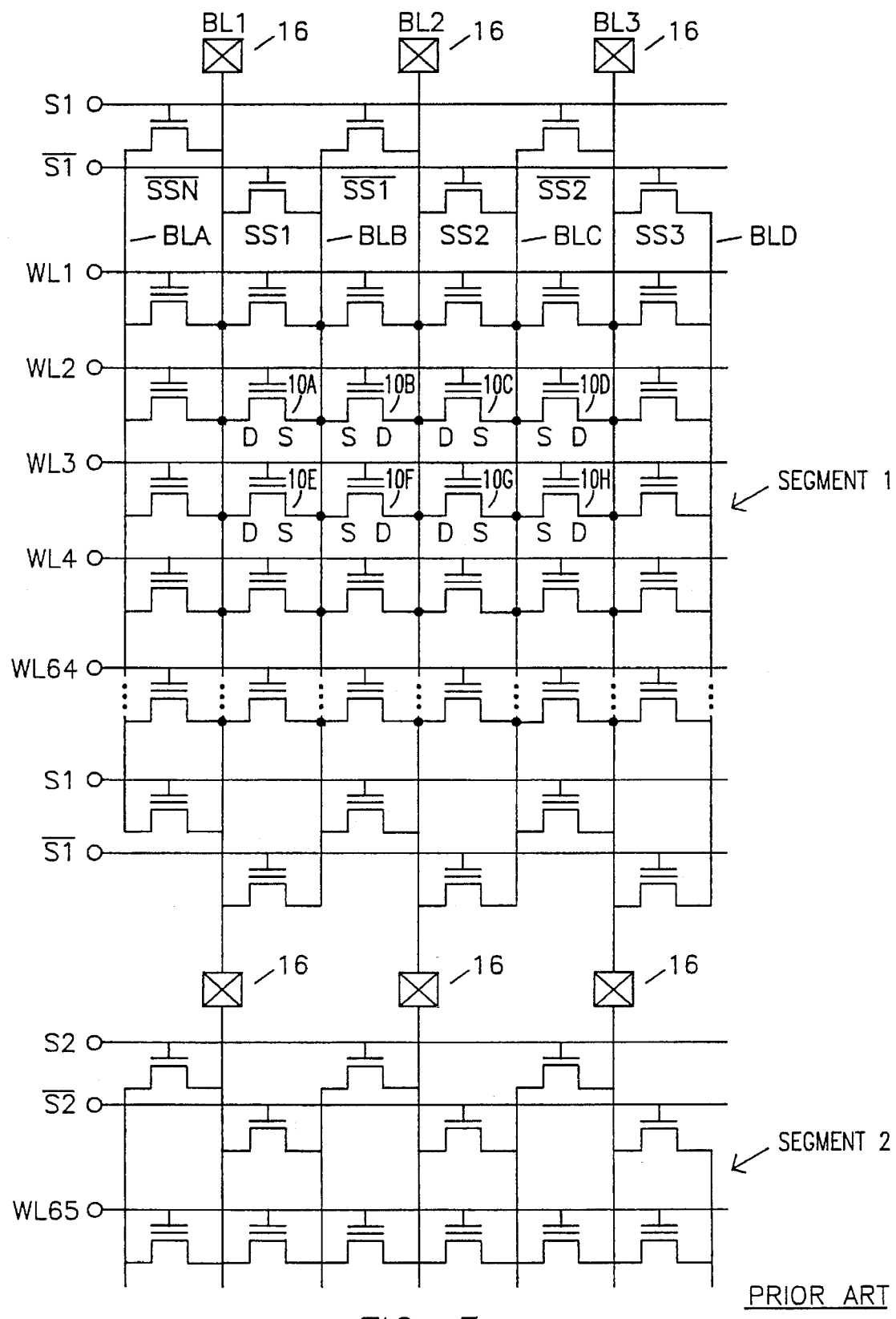
FIG. 3 is a diagram of a conventional alternate metal virtual ground (AMG) memory array.

It is important to note that when the successive memory read operations take place, the selected bit lines BL are switched between ground and a positive voltage. However, the length of the bit line is limited to the selected segment and does not extend the full length of the array as does the conventional AMG array, such as shown in FIG. 3. Thus, the speed of successive memory read operations is not inhibited by a long bit line connected to a large number of cell drains.

Note that the source lines SLN of the subject array extend the full length of the array. However, since these lines remain at ground potential during successive read operations, the large capacitance associated with the source lines does not increase the speed of memory operation. On the contrary, the large capacitance of the source line actual functions to reduce noise on the line thereby increasing operation reliability. The fact that the source lines are switched in successive memory program operations does not reduce the overall speed of memory operations since, as previously noted, EPROM devices are inherently orders of magnitude slower in program operations as compared to read operations and are, for that reason, used almost exclusively for read mostly applications.

As an alternative method of programming, the function of the drain and source regions of the cells are reversed. For purposes of consistency, and as previously explained, the drain region of the subject N channel memory cells 10 is defined as that region of the cell connected to the most positive voltage during the cell read operations. Thus, using the alternative programming method, the source of the cell to be programmed is connected to a positive voltage and the drain is grounded. For example, if cell 10B is being programmed, line A2 is grounded and select transistor SS2 is rendered conductive by signal SEG1. Further, the source of the cell 10B is connected to a positive voltage by connected the voltage to contact 16B and turning on transistor SC2.

Figure 5:
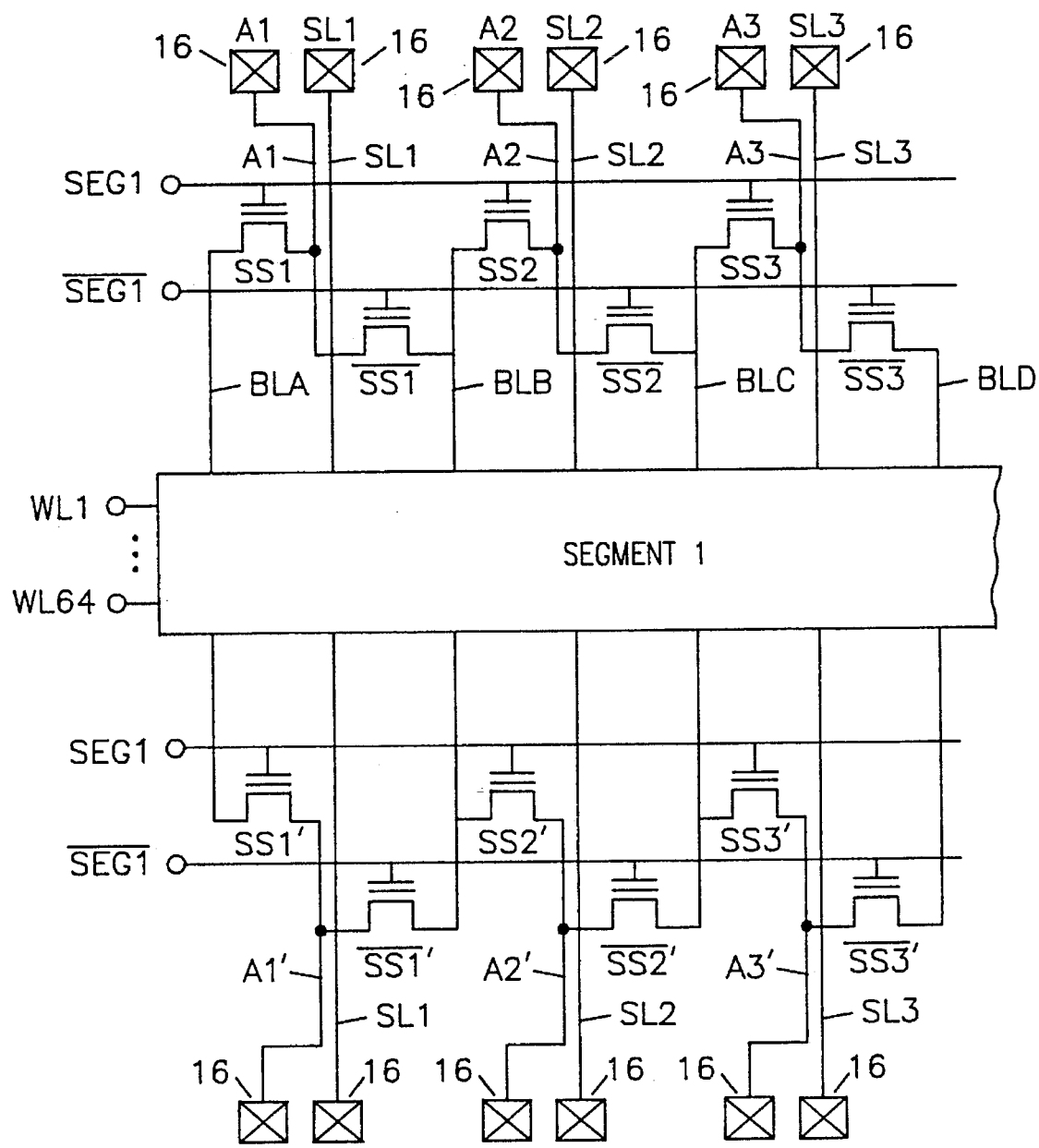
FIG. 5 is a diagram of a portion of an alternative memory array in accordance with the present invention showing double polysilicon segment select transistors.

If the first described programming method is used, the select transistors SLN are preferably conventional single poly MOS transistors as shown in FIG. 4 as are the source select transistors SCN. Double poly transistors, such as the transistors used in the memory cells 10, and which are erased to a low threshold voltage state, should not be used since the relatively large programming voltage applied to double poly select transistors will have a tendency to program the transistors to an undesired high threshold state. However, in the alternative programming method, the select transistors SSN are not required to conduct the large programming voltage. Thus, the select transistors SSN can be either single poly transistors as shown in FIG. 4 or double poly transistors erased to a low threshold voltage state as shown in FIG. 5. In the event double poly transistors select transistors SSN are used, the fabrication process can be simplified by locating the single poly source select transistors SCN outside the memory array. In that event, no single poly devices need be located inside the memory array.

Figure 6:
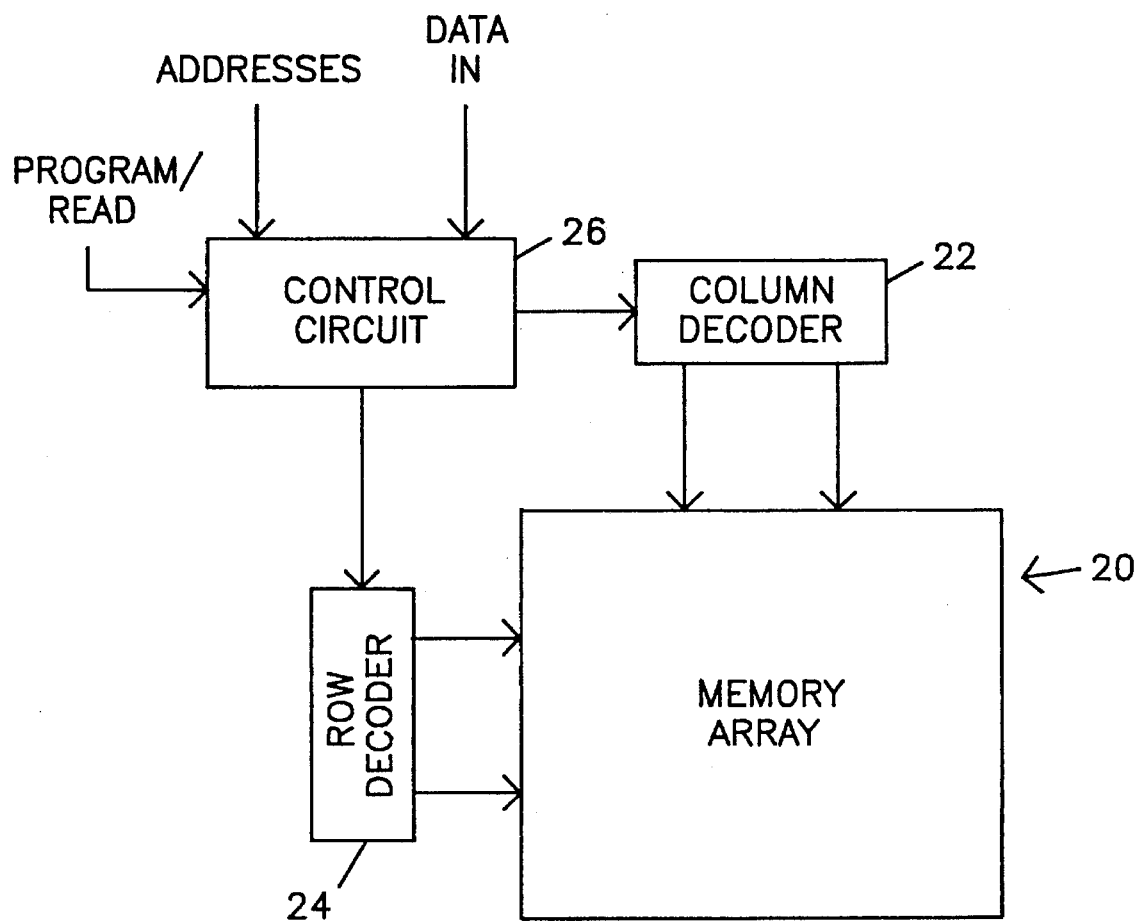
FIG. 6 is a simplified block diagram of a memory system which can be implemented in accordance with the present invention.

FIG. 6 shows a simplified block diagram of the overall memory system. The system includes a memory array 20 which includes the various array segments. The circuitry for decoding addresses for memory read and program operations includes a Column Decoder 22. Column decoder 22 comprises the segment select transistors SSN and the source control transistors SCN together with the appropriate voltages to be applied to the source and bit lines during program and read operations. The exact magnitude of these voltages is dependent upon the characteristics of the particular memory cell 10 being used and are equivalent to those used in a conventional AMG array.

The system also includes Row Decoders 24 for decoding addresses for memory read and program operations together with the appropriate voltages to be applied to the word lines during read and program operations. Again, the voltage magnitudes are dependent on the characteristics of the particular cell 10 being used. Both the Row and Column Decoders 22, 24 are controlled by a Control Circuit block 26 which generates the appropriate control signals SEGN, $\overline{SEGN}$, SN and related signals for carrying out both read and program operations. The particular implementation of the Column and Row Decoders and the Control circuit is readily apparent to those skilled in the art and forms no part of the present invention. Accordingly, details of such implementation will not be disclosed so as to avoid obscuring the true nature of the present invention in unnecessary detail.

One further advantage of the disclosed memory array is that it much of the technology associated with conventional AMG arrays, such as the memory cell 10 structure, can be used. Also, since the disclosed alternating metal bit line architecture is very similar to that of conventional AMG arrays, essentially the same layout can be used. For this reason, it is unnecessary to include a description of the actual physical layout of the disclosed architecture or the peripheral control circuitry for generating and applying the appropriate voltages for programming and reading the cells in order to practice the subject invention. These details are well known to those skilled in the art and familiar with conventional AMG devices. In addition, details of the fabrication of the subject memory array will not be disclosed since the fabrication process for implementing the subject invention is conventional and forms no part of the subject invention.

Thus, a novel EPROM array has been disclosed. Although a preferred embodiment has been described in some detail, it is to be understood that certain changes can be made by those skilled in the art without departing from the spirit and scope of the invention as defined by the appended claims.

I claim:

1. An EPROM memory system comprising:

a plurality of memory segments, each memory segment comprising:

a plurality of source bit lines;

a plurality of drain bit lines arranged so that one drain bit line is formed between each adjacent pair of source bit lines;

a plurality of intermediate drain bit lines;

a plurality of word lines;

a plurality of memory cells arranged in rows and columns, each of the cells including a source, a drain, a channel disposed intermediate the source and drain, a floating gate disposed over and insulated from the channel, and a control gate disposed over and insulated from the floating gate, the sources of the cells in a first column of cells and the sources of the cells in an adjacent second column of cells both being connected to a same one of the plurality of source bit lines, the drains of the cells in the first column of cells and the drains of the cells in an adjacent third column of cells both being connected to a same one of the plurality of drain bit lines, the control gate of each of the cells in a row of cells being connected to one of the plurality of word lines; and a plurality of select transistors formed in a pair of rows so that, in each row of select transistors, one select transistor corresponds with every other column of memory cells, and so that, in the pair of rows, one select transistor corresponds with each column of memory cells, each select transistor including first and second terminals and a gate, the first terminals of a first select transistor in a first row of the pair of rows of select transistors and a second select transistor in a second row of the pair of rows of select transistors both being connected to a same one of the plurality of drain bit lines, the second terminals of a third select transistor in said second row of the pair of rows and the first select transistor both being connected to a same one of the plurality of intermediate drain bit lines; and control means for programming and reading selected cells, including read means for reading a selected cell by application of a voltage to the drain of the selected cell, the voltage being positive with respect to the source of the selected cell, utilizing the select transistor connected to the drain bit line associated with the selected cell.

2. The memory system of claim 1 wherein each row of select transistors has a corresponding select line connected to the gates of the select transistors in that row and wherein each pair of rows of select transistors includes a first select line and a second select line.

3. The memory system of claim 2 wherein the read means produces a first select signal and a second select signal, which is the complement of the first select signal, with the first select signal being applied to the first select line and the second select signal being applied to the second select line associated with the segment in which the cell to be read is located.

4. The memory system of claim 3 wherein the drain bit lines of one segment are electrically isolated from the drain bit lines of the other segments.

5. The memory system of claim 4 wherein each of the source bit lines of one segment have a corresponding source bit line in the other segments, with the corresponding source bit lines being connected together so that each of the source bit lines extend across all of the segments.

6. The memory system of claim 5 wherein the source bit lines are formed as buried semiconductor source bit lines.

7. The memory system of claim 6 wherein each buried semiconductor source bit line has a corresponding metal source bit line connected thereto.

8. The memory system of claim 7 wherein the drain bit lines each comprise a buried semiconductor drain bit line.

9. The memory system of claim 5 wherein the read means includes means for grounding the source bit lines, with respect to an array circuit common, connected to the selected cell.

10. The memory system of claim 9 wherein the read means functions to apply the positive voltage to the drain of the selected cell by applying a positive voltage to the first terminal of the select transistor that corresponds with the selected cell, add by causing the select transistor that corresponds with the selected cell to become conductive.

11. The memory system of claim 10 wherein the control means further includes a plurality of source transistors connected to the plurality of source bit lines extending across all of the segments such that one source transistor is connected to each extended source bit line so that each extended source bit line has a state which can be selectively controlled utilizing the source transistor.

12. The memory system of claim 11 wherein the read means functions to cause the source bit line associated with the selected cell to be grounded with respect to the circuit common.

13. The memory system of claim 12 wherein the control means further includes program means which functions to program a selected cell by application of a positive voltage, with respect to the drain of the selected cell, to the source bit line associated with the selected cell.

14. The memory system of claim 13 wherein the program means functions to apply the positive voltage by way of the source transistor connected to the selected cell to be programmed.

15. The memory system of claim 12 and further including program means for programming the selected cell, wherein the program means functions to apply a positive voltage to the drain bit line associated with the selected cell to be programmed.

16. The memory system of claim 15 wherein the program means further functions to cause the source bit line of the selected cell to be programmed to be grounded with respect to the circuit common.

17. An EPROM memory system comprising:

a memory array comprising a plurality of segments, each of the segments including alternating bit and source lines and a plurality of memory cells formed in a plurality of rows so that, in each row of memory cells, one cell is formed between each bit and source line, the bit lines in one segment being electrically isolated from the bit lines in other segments, the source lines extending across all of the segments, each row of cells including a corresponding word line, the plurality of cells including a first cell having a control gate connected to a word line, a drain connected to a first bit line, and a source connected to a first source line adjacent the first bit line, and a second cell having a control gate connected to the word line connected to the first cell, a source connected to the first source line, and a drain connected to a second bit line adjacent the first source line;

select means formed in each segment for connecting a first node to a selected one of said first and second bit lines; and source line control means for controlling a voltage level of the first source line independent of the select means; and control means for programming and reading selected cells of the memory array, including read means for reading a selected cell by applying a positive voltage, with respect to an array circuit common, to the first node, and by causing said select means to connect the first node to the bit line connected to the drain of the selected cell.

18. The memory system of claim 17 wherein the select means includes first and second select transistors, each having first and second terminals and a gate, with the first transistor having its first terminal connected to the first node and its second terminal connected to the first drain bit line, and the second transistor having its first terminal connected to the first node and its second terminal connected to the second drain bit line.

19. The memory system of claim 18 wherein the source line control means includes a control transistor having first and second terminals and a gate, with the first terminal being connected to the source bit line.

20. A method of controlling a memory array which includes a plurality of segments, with each of the segments including alternating drain and source bit lines, select means, source line control means, and a plurality of memory cells formed in a plurality of rows so that, in each row of memory cells, one cell is formed between each drain and source bit line, the drain bit lines in one segment being electrically isolated from the drain bit lines in other segments, the source bit lines extending across all of the segments, each row of cells including a corresponding word line, the plurality of cells including a first cell having a control gate connected to a word line, a drain connected to a first drain bit line, and a source connected to a first source bit line, and a second cell having a control gate connected to the word line connected to the first cell, a source connected to the first source bit line, and a drain connected to a second drain bit line, the select means formed in each segment for connecting a first node to a selected one of said first and second drain bit lines, with the first node being electrically isolated from the source bit lines, the source line control means controlling a voltage level of the source bit lines independent of the select means, the method comprising the following steps:

programming a selected one of the cells, including the step of applying a positive voltage, with respect to a circuit common, to a word line that corresponds with the selected cell; and reading a selected one of the cells, including the steps of applying a voltage to the drain bit line connected to the drain of the selected cell, and applying a voltage to the word line connected to the control gate of the selected cell, with the applied voltages being positive with respect to the source of the selected cell.

* * * * *

UNITED STATES PATENT AND TRADEMARK OFFICE
CERTIFICATE OF CORRECTION

PATENT NO. : 5,583,808
DATED : December 10, 1996
INVENTOR(S) : Dhaval J. Brahmbhatt It is certified that error appears in the above-indentified patent and that said Letters Patent is hereby corrected as shown below:

In Col. 10, line 39, delete "add" and replace with --and--.

In Col. 12, line 6, delete "bit".

Signed and Sealed this

Fourth Day of March, 1997

Attest:

BRUCE LEHMAN

Attesting Officer     Commissioner of Patents and Trademarks